US007915543B2

(12) United States Patent
Riner

(10) Patent No.: US 7,915,543 B2
(45) Date of Patent: Mar. 29, 2011

(54) ISOLATOR ASSEMBLY, RECEPTACLE AND METHOD OF OPERATION

(75) Inventor: Raymond H. Riner, Fort Wayne, IN (US)

(73) Assignee: Group Dekko, Inc., Kendallville, IN (US)

( * ) Notice: Subject to any disclaimer, the term of this patent is extended or adjusted under 35 U.S.C. 154(b) by 290 days.

(21) Appl. No.: 12/254,363

(22) Filed: Oct. 20, 2008

(65) Prior Publication Data

US 2010/0096182 A1 Apr. 22, 2010

(51) Int. Cl.
*H05K 7/12* (2006.01)

(52) U.S. Cl. ........ 174/535; 174/659; 174/660; 411/170; 439/452

(58) Field of Classification Search .................. 174/659, 174/660, 50.52, 535; 411/104, 170; 439/452, 439/460, 470
See application file for complete search history.

(56) References Cited

U.S. PATENT DOCUMENTS

| | | | | |
|---|---|---|---|---|
| 3,430,991 | A | 3/1969 | Otto | |
| 3,480,061 | A | 11/1969 | Leistner | |
| 4,103,101 | A | 7/1978 | Maier | |
| 5,503,511 | A | 4/1996 | Flamme | |
| 5,728,971 | A | 3/1998 | Nash | |
| 5,795,117 | A | 8/1998 | Onoda | |
| 6,537,103 | B2 | 3/2003 | Jamison | |
| 6,595,732 | B2 * | 7/2003 | Werner et al. | 411/104 |
| 6,811,363 | B1 | 11/2004 | Minnich | |
| 7,114,987 | B2 * | 10/2006 | Nad | 439/470 |
| 7,214,890 | B2 * | 5/2007 | Kiely et al. | 174/666 |
| 7,338,245 | B2 * | 3/2008 | Ladouceur | 411/427 |
| 7,554,041 | B2 * | 6/2009 | Ducret | 174/655 |

* cited by examiner

*Primary Examiner* — Dhiru R Patel
(74) *Attorney, Agent, or Firm* — Taylor IP, P.C.

(57) ABSTRACT

An isolator assembly includes an electrical receptacle housing. The housing defines an aperture extending inwardly from a first exterior wall of the housing and a longitudinal centerline of the aperture. The housing further has an internal cavity extending from the aperture and a slot spaced from the internal cavity and extending from a second exterior wall of the housing. The slot is generally perpendicular to the longitudinal centerline of the aperture. The isolator assembly also includes a plurality of terminals positioned in the housing, a nut sized for placement in the slot of the housing, a conduit fitting including a stem having a portion thereof sized for placement in the aperture of the housing, and a flexible conduit. The conduit is connected to the conduit fitting and contains a plurality of electrical conductors connected to the plurality of terminals within the electrical receptacle housing.

22 Claims, 10 Drawing Sheets

ISOLATOR ASSEMBLY, RECEPTACLE AND METHOD OF OPERATION

BACKGROUND OF THE INVENTION

1. Field of the Invention

The present invention relates to electrical fittings and, more particularly, to electrical outlet boxes.

2. Description of the Related Art

Electrical power is distributed by networks of electrical conduits that terminate in electrical outlet boxes where the electrical power is accessed. Power from the electrical conduits is connected in the outlet boxes to electrical receptacles positioned on the boxes. The electrical receptacles have slots and apertures for receiving prongs of appliances and to connect to other electrical devices. Such networks are used in residential and commercial construction, as well as, in mobile structures such as trailers and motor homes.

Typically, the electrical conduits have a threaded stem that is fitted into an opening in an electrical outlet box. The stem is secured to the electrical outlet box by a threaded nut, for example, a Romex nut. Electrical wires within the electrical conduits are connected to the electrical receptacle by connectors within the electrical outlet box.

The threaded nut is located within the electrical outlet box and is accessed to secure the nut to the box by at least partially removing the electrical receptacle. After the electrical wires within the electrical conduits are connected to the electrical receptacle, the electrical receptacle is secured to the electrical outlet box.

The threaded nut may loosen with time, compromising the securement of the electrical receptacle to the electrical outlet box. Vibrations in environments, such as mobile structures, may hasten the loosening of the threaded nut. Further, the loosening of the threaded nut may progress until it comes off the stem and becomes loose within the electrical outlet box. The loose nut may contact wires or electrical connectors within the box.

What is needed in the art is an electrical box and receptacle assembly that is more reliable and secure.

SUMMARY OF THE INVENTION

The invention in one form is directed to an isolator assembly having an electrical receptacle housing. The housing defines an aperture extending inwardly from a first exterior wall of the housing and a longitudinal centerline of the aperture. The housing further has an internal cavity extending from the aperture and a slot spaced from the internal cavity and extending from a second exterior wall of the housing. The slot is generally perpendicular to the longitudinal centerline of the aperture. The isolator assembly also includes a plurality of terminals positioned in the housing, a nut sized for placement in the slot of the housing, a conduit fitting including a stem having a portion thereof sized for placement in the aperture of the housing and a flexible conduit. The conduit is connected to the conduit fitting and contains a plurality of electrical conductors connected to the plurality of terminals within the electrical receptacle housing.

The invention in another form is directed to a method for wiring an electrical receptacle. The method includes the step of providing an electrical receptacle housing. The housing has an aperture extending inwardly from a first exterior wall of the housing, an internal cavity extending from the aperture, and a slot. The slot is spaced from the internal cavity and extends from a second exterior wall of the housing. The method also includes the steps of providing a conduit fitting including a stem, providing a nut, placing the nut into the slot of the housing, inserting the stem into the aperture of the housing, and threading the nut onto the stem.

BRIEF DESCRIPTION OF THE DRAWINGS

The above-mentioned and other features and advantages of this invention, and the manner of attaining them, will become more apparent and the invention will be better understood by reference to the following description of embodiments of the invention taken in conjunction with the accompanying drawings, wherein.

Corresponding reference characters indicate corresponding parts throughout the several views. The exemplifications set out herein illustrate embodiments of the invention and such exemplifications are not to be construed as limiting the scope of the invention in any manner.

DETAILED DESCRIPTION OF THE INVENTION

Figure 1:
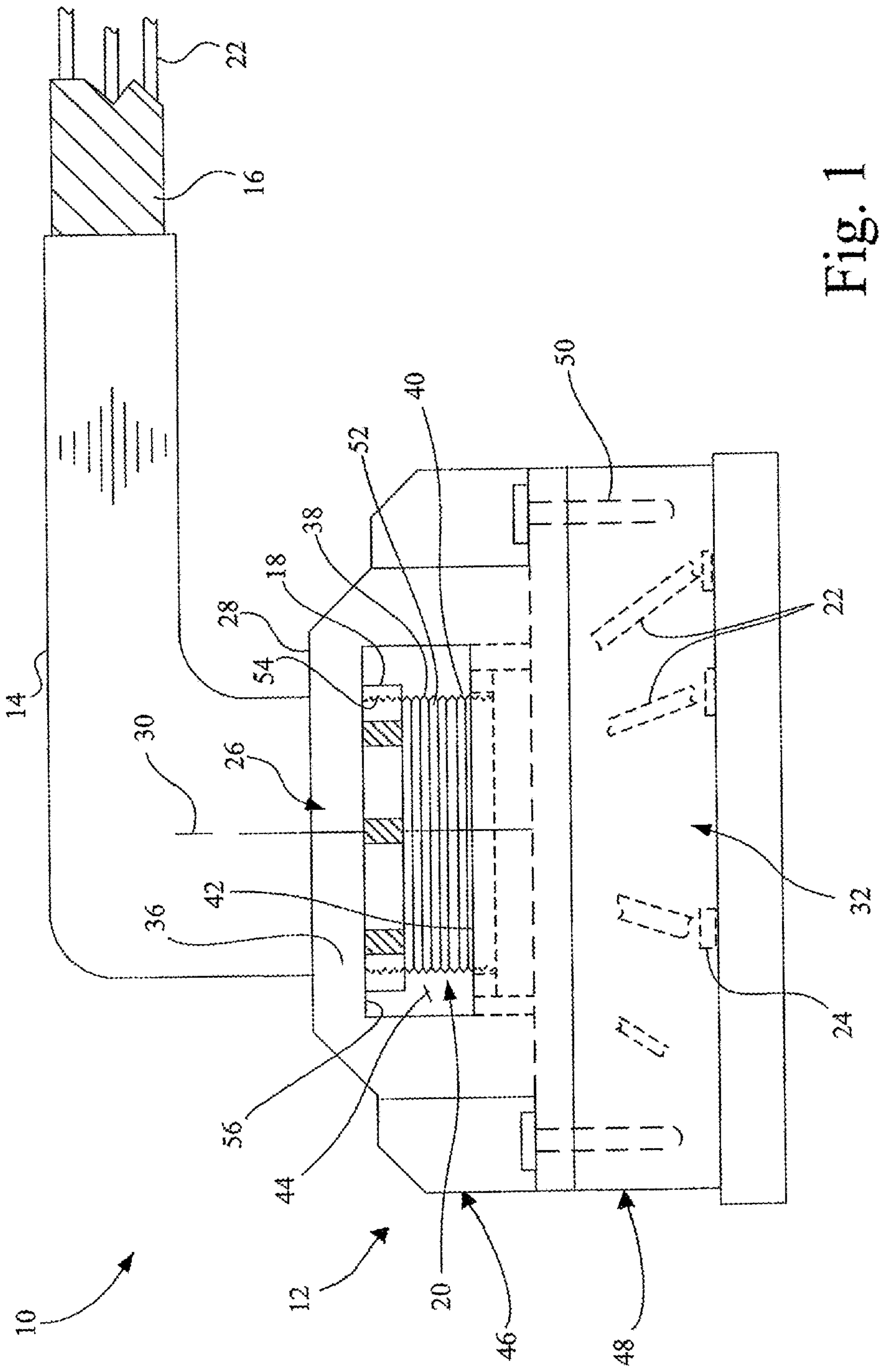
FIG. 1 is a side view of an embodiment of an isolator assembly of the present invention.

According to the present invention and referring now to FIG. 1, an isolator assembly 10 is shown. The isolator assembly 10 includes an electrical receptacle housing 12. A conduit fitting 14 connects a flexible conduit 16 to the electrical receptacle housing 12. The isolator assembly 10 further includes a nut 18 placed in a slot 20 formed in the housing 12. Electrical conductors 22 within the conduit 16 are connected to terminals 24 in the housing 12. The electrical receptacle housing 12 defines an aperture 26 extending inwardly from a first exterior wall 28 of the housing 12. The housing 12 defines a longitudinal centerline 30 of the aperture 26. The housing 12 further defines an internal cavity 32 extending from the aperture 26. The housing 12 also defines the slot 20 that is spaced from the internal cavity 32 and extends from a second exterior wall 36 of the housing 12. The slot 20 is generally perpendicular to the longitudinal centerline 30 of the aperture 26. The nut 18 is sized for placement in the slot 20 of the housing 12. The conduit fitting 14 includes a stem 38 having a portion 40 of the stem 38 sized for placement in the aperture 26 of the housing 12.

The slot 20 serves to keep the nut 18 from entering the internal cavity 32 of the electrical receptacle housing 12. The nut 18 is trapped within the slot 20 and may not advance toward the internal cavity 32. Thus, the slot 20 of the electrical receptacle housing 12 serves to mechanically and electrically isolate the nut 18 from the internal cavity 32 of the housing 12. Thus, the nut 18, if it becomes loose from the conduit fitting 14, may not advance into the internal cavity 32 of the housing 12 and contact any of the plurality of terminals 24 or any of the plurality of electrical inductors 22, therefore, assuring the safety of the isolator assembly 10.

As shown in FIG. 1, the housing 12 includes a third wall 42 spaced from the first exterior wall 28 of the electrical receptacle housing 12. The third wall 42 may, as shown, be parallel to the first exterior wall 28 of the electrical receptacle housing 12. The slot 20 is positioned between the first exterior wall 28 and the second exterior wall 36. The third wall 42 separates the slot 20 from the internal cavity 32 of the housing 12. The aperture 26 extends inwardly from the third wall 42 and into the internal cavity 32. The nut 18 is sized to prohibit passage of the nut 18 through the aperture 26 and into the internal cavity 32. The nut 18 is further sized to permit rotation of the nut 18 within the slot 20.

The slot 20 is a blind slot in that the slot 20 is partially formed by or terminates in a back wall 44 of the housing 12. The slot 20 formed in the housing 12, therefore, contains the nut 18 on three sides, facilitating the assembly of the nut 18 into the isolator assembly 10. It should be appreciated, however, that the slot 20 may, alternatively, extend completely through the housing 12.

As shown in FIG. 1, the housing 12 includes an electrical receptacle conduit connection portion or first portion 46 and a distal and an electrical receptacle faceplate portion or second portion 48. The first portion 46 and the second portion 48 are removably secured to each other to form the housing 12. The first portion 46 of the housing 12 defines the aperture 26 and the slot 20, while the second portion 48 defines at least a portion of the internal cavity 32. The internal cavity 32 is configured to receive at least a portion of the plurality of electrical conductors 22.

The first portion 46 may be secured to the second portion 48 by, for example, fasteners 50 in the form of self-tapping screws. The conduit fitting 14 of the isolator assembly 10 of FIG. 1 may, as shown, be in the form of an elbow clamp and may include external threads 52 formed on portion 40 of the stem 38 of the fitting 14. The external threads 52 mate with internal threads 54 formed in the nut 18.

The first portion 46 of the housing 12, as shown in FIG. 1, includes internal face 56 of the first external wall 28. The internal face 56 is perpendicular to longitudinal centerline 30 of the aperture 26. The slot 20 is formed between the second exterior wall 36 and the internal face 56 of the first external wall 28. As shown in FIG. 1 the slot 20 receives the nut 18 and the nut 18 is used to secure the conduit fitting 14 against the internal face 56 of the first external wall 28 of the housing 12 and the first external wall 28 of the housing 12. The electrical conductors 22 are fitted within flexible conduit 16 and pass through the conduit fitting 14 and the aperture 26, extending into the internal cavity 32. The electrical conductors 22 are connected to terminals 24 within the internal cavity 32.

Figure 2:
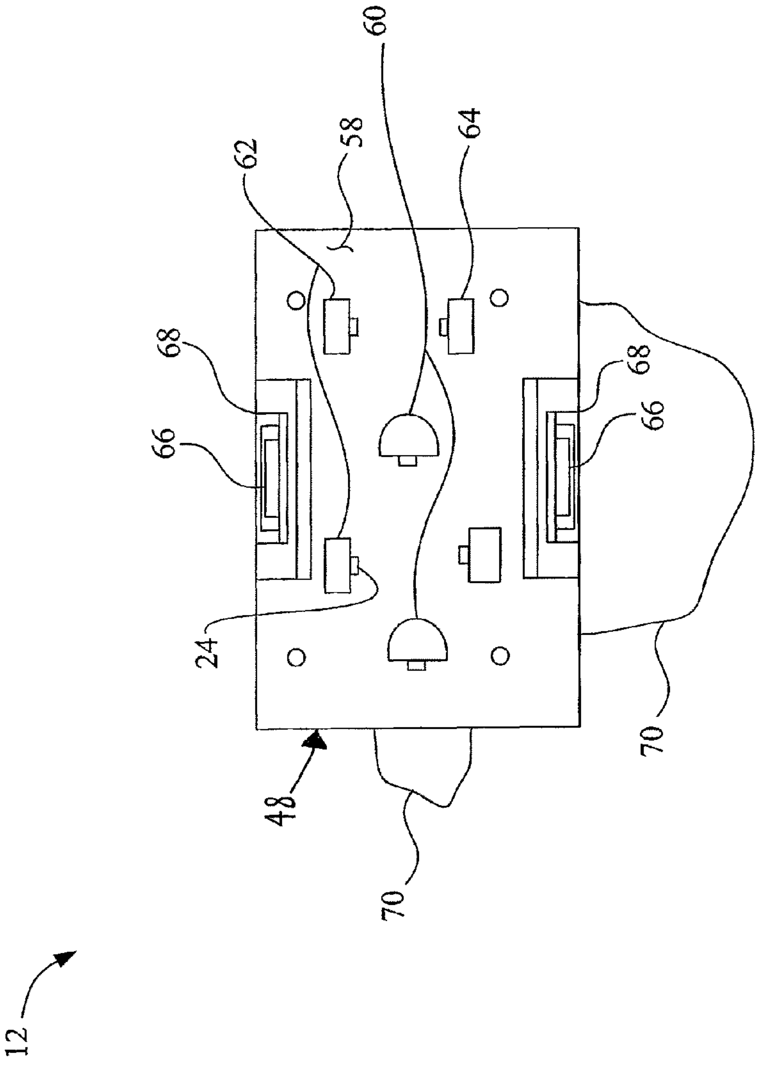
FIG. 2 is a bottom view of the electrical receptacle housing assembly of the isolator assembly of FIG. 1, showing the faceplate of the electrical receptacle housing assembly in greater detail.

Referring now to FIG. 2, bottom face 58 of the second portion 48 of the housing 12 of isolator assembly 10 is shown. The bottom face 58 as shown is a faceplate in the form of an electrical duplex. The faceplate 58 includes a pair of grounding openings 60 as well as a pair of neutral slots 62 and a pair of hot slots 64. One of the terminals 24 is associated with each of the grounding openings 60, the neutral slots 62, and the hot slots 64. The faceplate 58 further includes a pair of opposed tabs 66 which extend from opposed arms 68 extending from the second portion 48 of the housing 12. The tabs 66 are used to releasably secure the second portion 48 of the housing 12 from wall 70 of the living space at which the isolator assembly 10 is installed. While the faceplate 58 may be in the form of an electrical duplex, it should be appreciated that the faceplate 58 may be in the form of any electrical connection. For example, the faceplate 58 may be in the form of a light socket or a switch.

Figure 3:
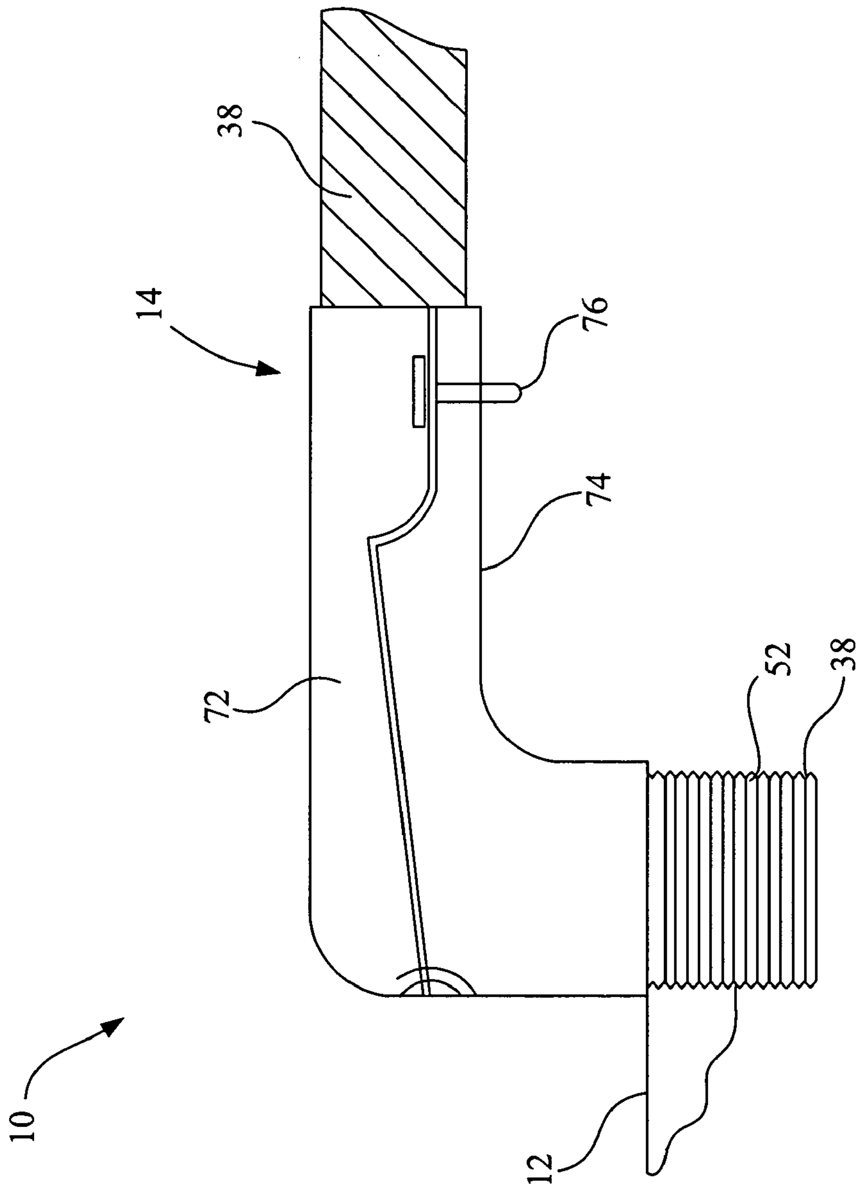
FIG. 3 is a side view of the conduit fitting of the isolator assembly of FIG. 1, including the elbow clamp and the flexible conduit.

Referring now to FIG. 3, the conduit fitting 14 of the isolator assembly 10 is shown in greater detail. The conduit fitting 14 is secured to the flexible conduit 16 as well as to housing 12. As shown, the conduit fitting 14 has a generally cylindrical cavity for receiving a generally cylindrical flexible conduit 16. The conduit fitting 14, as shown, includes an upper portion 72 and a lower portion 74 that are secured together by fasteners in the form of self-tapping screws 76. The lower portion 74 includes the stem 38 having the external threads 52.

Figure 4:
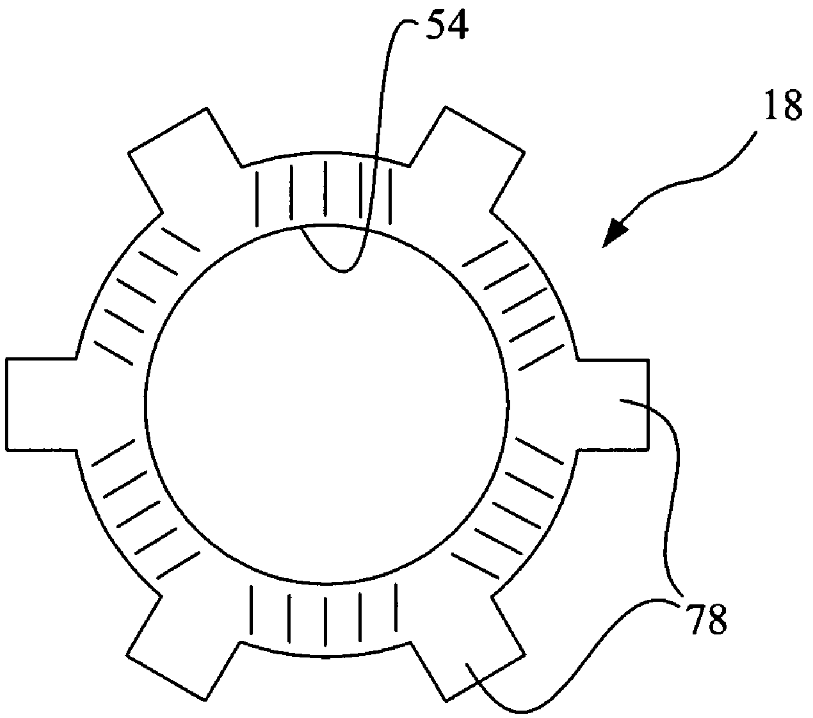
FIG. 4 is a plan view of the nut of the isolator assembly of FIG. 1.

Referring now to FIG. 4, the nut 18 is shown in greater detail. The nut 18 has cylindrical internal threads 54, as well as a plurality of spaced-apart protrusions 78. The protrusions 78 are used to tighten the nut 18 while it is fitted in the slot 20. The nut 18 has six equally spaced apart protrusions 78. Six protrusions 78 are sufficient to have at least one protrusion 78 in the open portion of the slot 20 at all times so that the nut 18 may be easily tightened and loosened. Alternatively, any other number of protrusions or any other feature on the nut may be provided to turn the nut.

It should be appreciated that the flexible conduit 16, the conduit fitting 14, and the nut 18 may be made of any suitable, durable material and may be made of electrically conductive material or an electrically insulative material. For example, the nut 18, the conduit fitting 14, and the flexible conduit 16 may be made of a suitable, durable metal. It should be appreciated that, alternatively, the conduit 16, the conduit fitting 14 and the nut 18 may be made of a composite or of a polymer.

Figure 5:
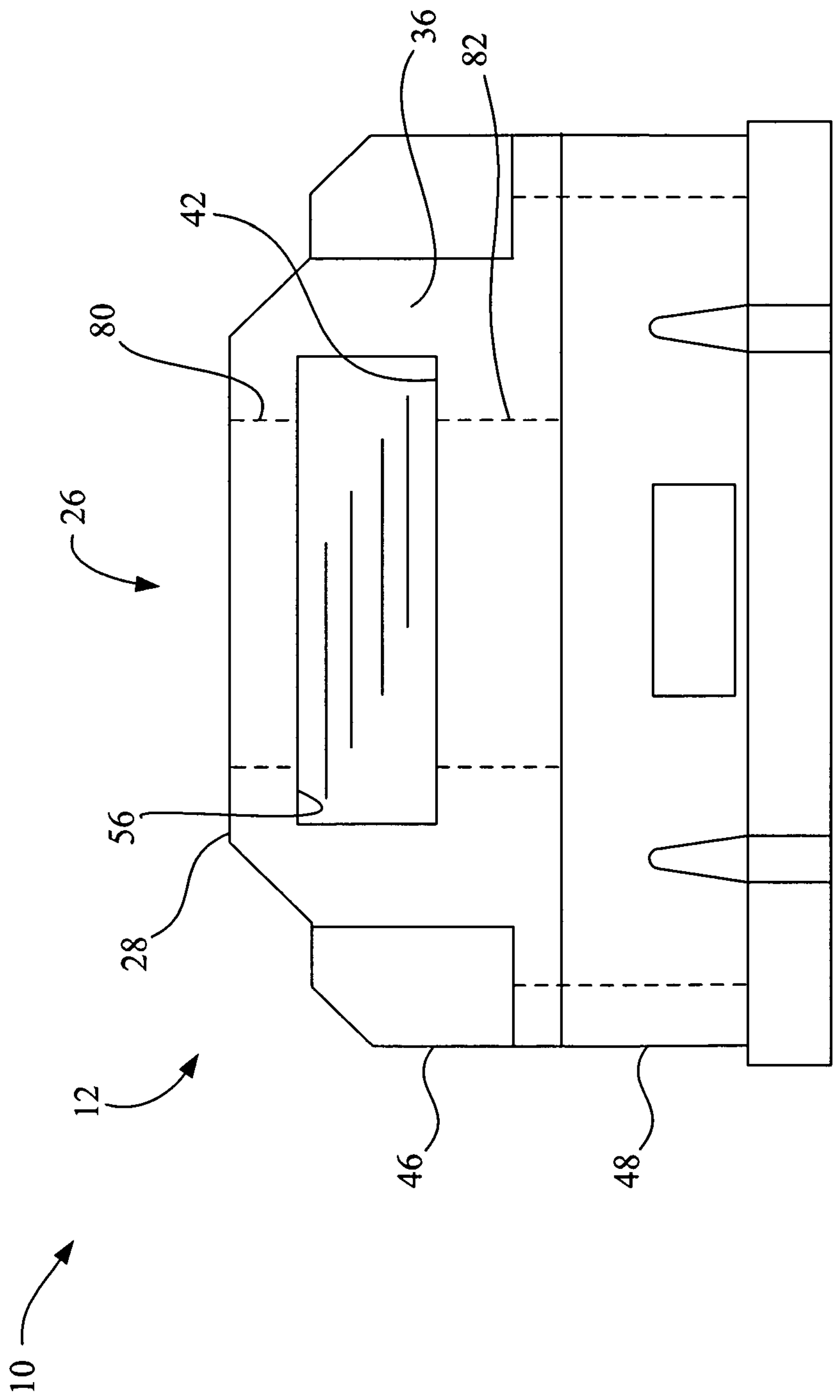
FIG. 5 is a side view of the electrical receptacle housing assembly of the isolator assembly of FIG. 1.

Referring now to FIG. 5, the first portion 46 and the second portion 48 of the housing 12 are shown connected to each other. The first portion 46 of the housing 12 defines the aperture 26 which includes a cylindrical opening or hole 80 through first external wall 28 of the housing 12 and a cylindrical hole or opening 82 through the third wall 42 of the first portion 46 of the housing 12.

Figure 6:
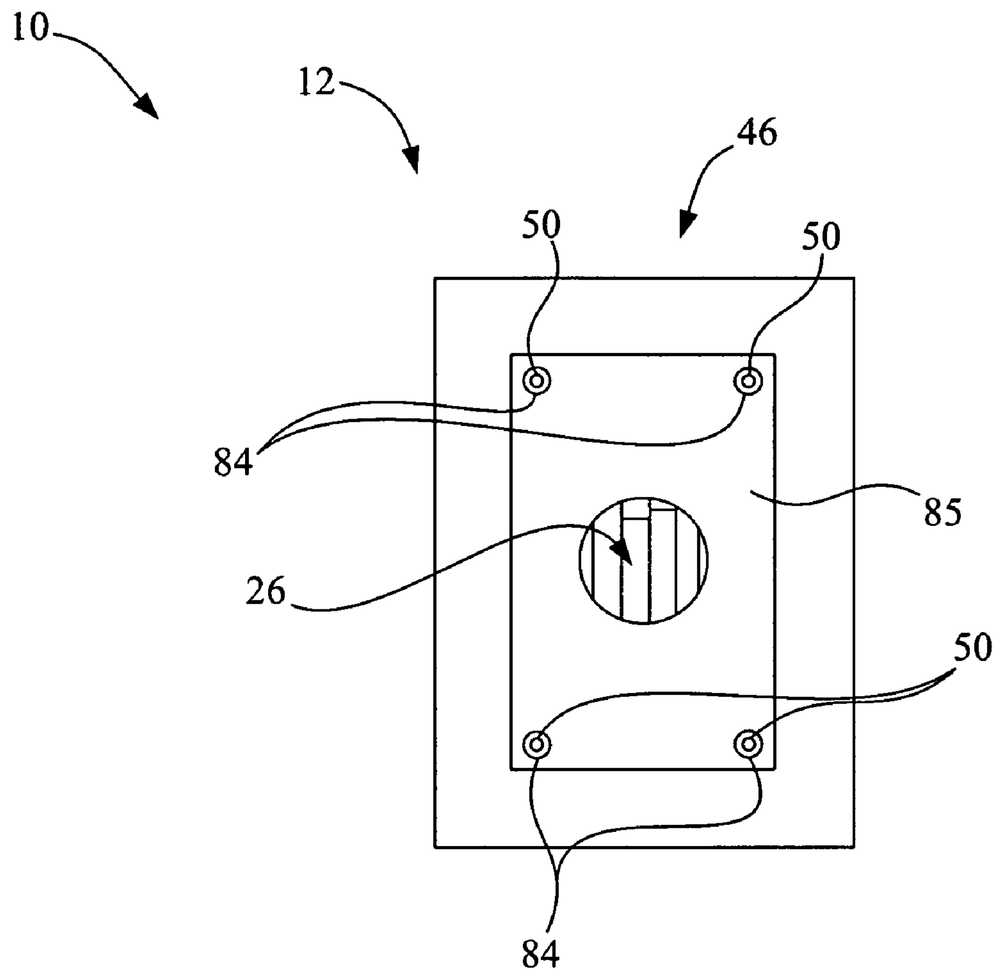
FIG. 6 is a top view of the electrical receptacle housing assembly of the isolator assembly of FIG. 1, showing the hole in the top of the receptacle housing assembly.

Referring now to FIG. 6, the first portion 46 of the housing 12 of the isolator assembly 10 is shown viewed from the top of the isolator assembly 10. The first portion 46 includes openings 84 for receiving the fasteners 50 for securing the first portion 46 to the second portion 48.

Figure 7:
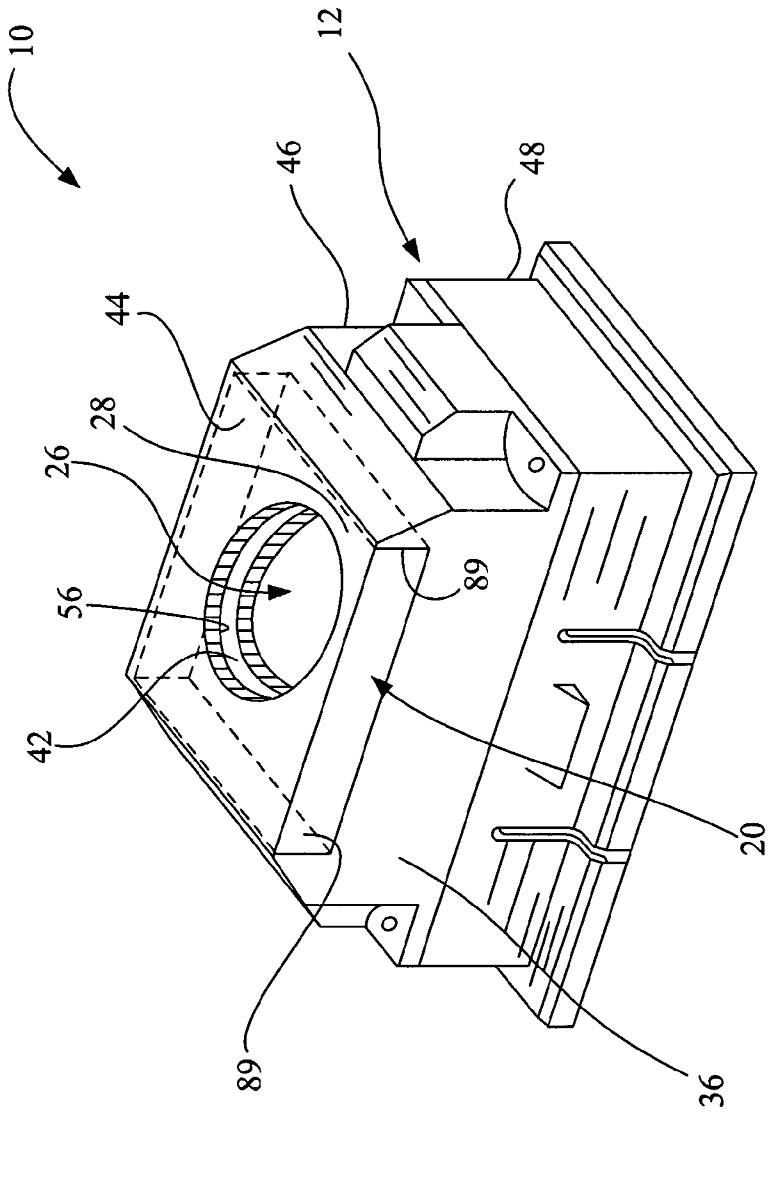
FIG. 7 is a perspective view of the electrical receptacle housing assembly of the isolator assembly of FIG. 1, showing the slot for receiving the nut in greater detail.

Referring now to FIG. 7, the slot 20 as shown is formed in the first portion 46 of the housing 12. The slot 20 is defined and bounded by the internal face 56 of the first external wall 28, second exterior wall 36, third wall 42, side walls 89, and back wall 44 of the first portion 46 of the housing 12.

Figure 8:
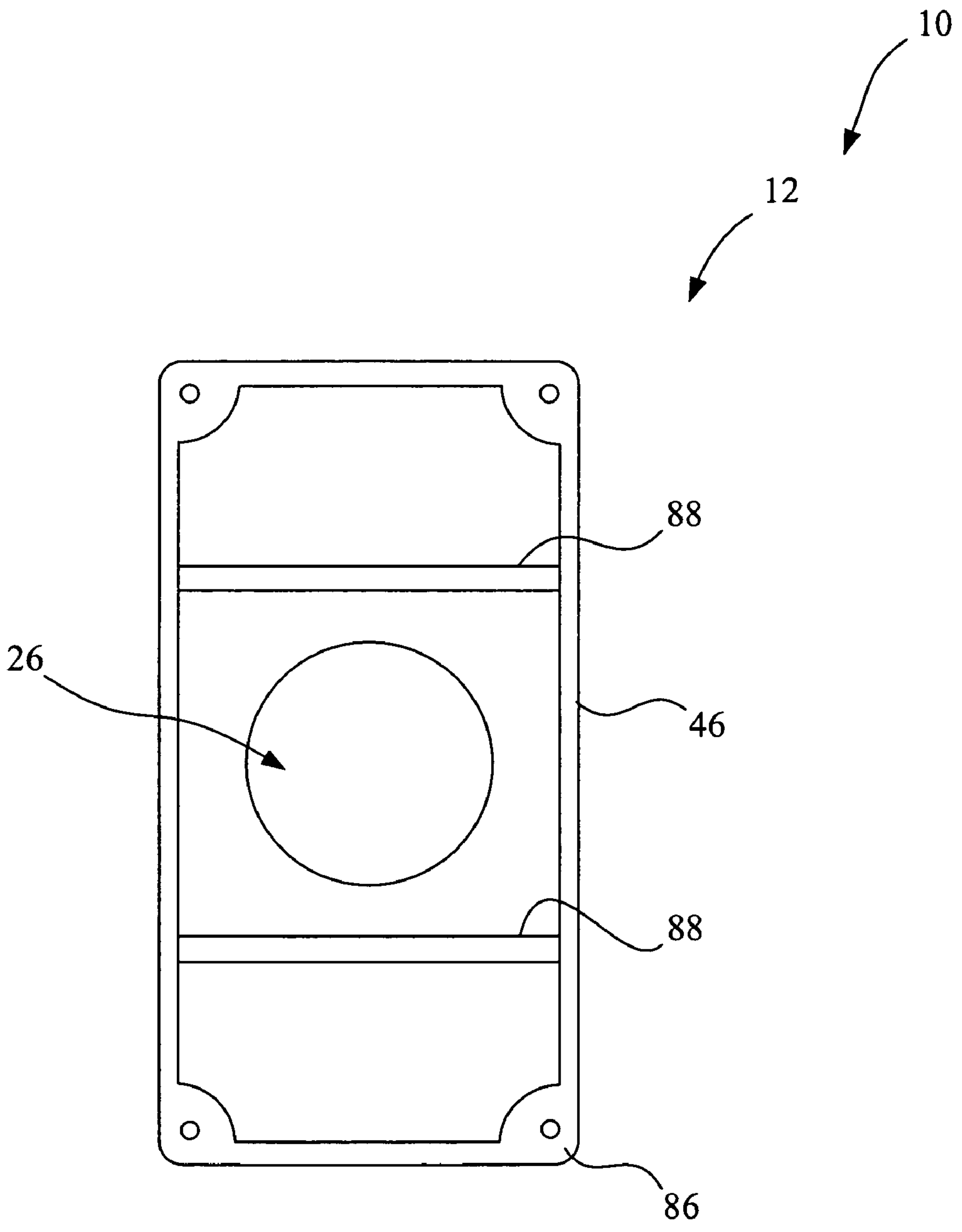
FIG. 8 is a bottom view of the electrical receptacle clamp connection portion of the electrical receptacle housing assembly of the isolator assembly of FIG. 1, showing the surface for engagement with the electrical receptacle faceplate portion in greater detail.

Referring now to FIG. 8, the first portion 46 of the housing 12 of the isolator assembly 10 is shown viewed from the bottom. The first portion 46 includes a contact surface 86 for contact with the second portion 48. The first portion 46 further includes a pair of transfer support ribs 88 for strengthening the first portion 46.

Figure 9:
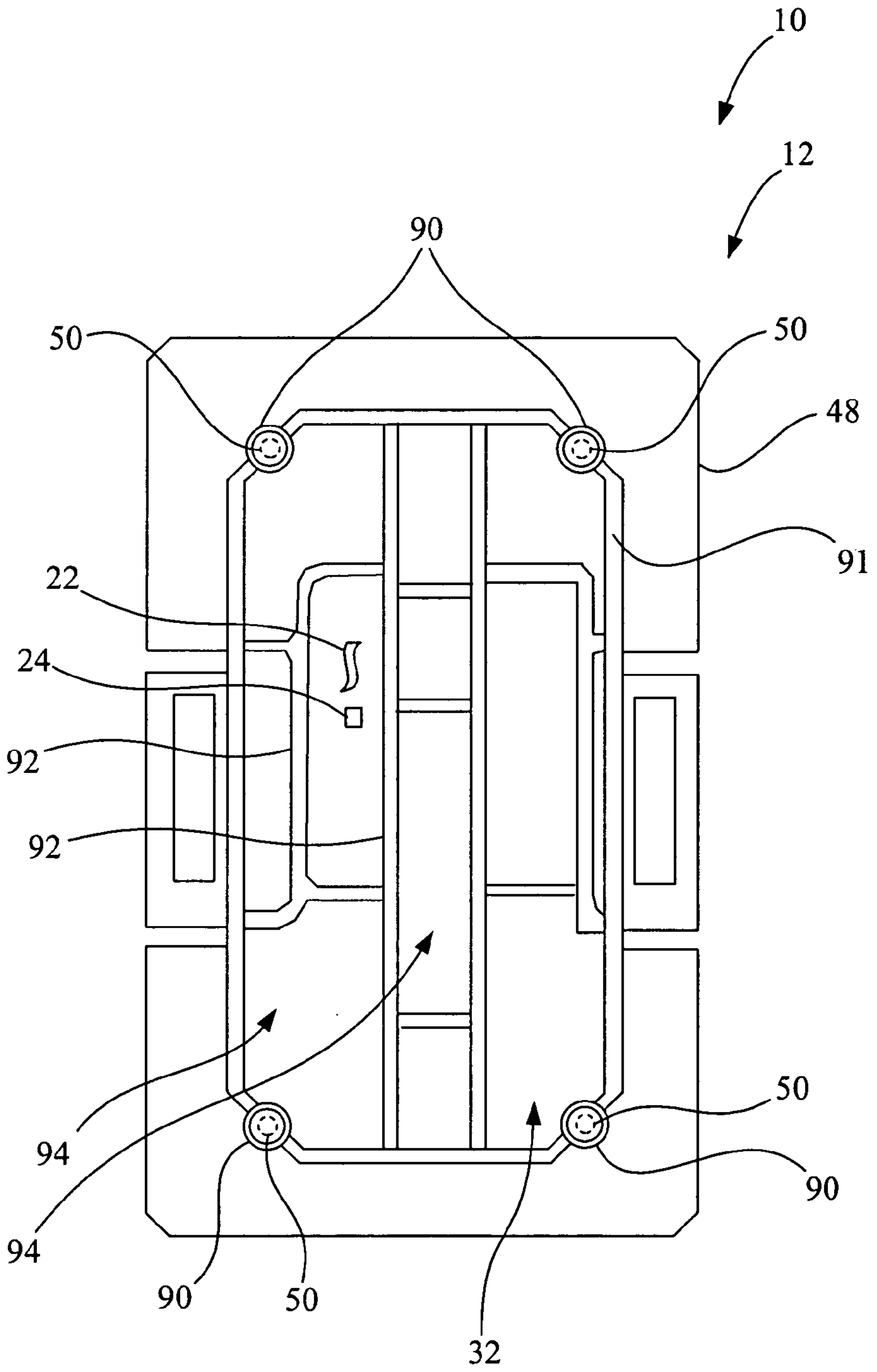
FIG. 9 is a top view of the electrical receptacle faceplate portion of the electrical receptacle housing assembly of the isolator assembly of FIG. 1, showing the electrical conductor passages and the surface for engagement with the electrical receptacle clamp connection portion in greater detail.

Referring now to FIG. 9, the second portion 48 of the housing 12 of the isolator assembly 10 is shown with the second portion 48 including a plurality of pockets 90 for threadably receiving the screws 50 that are used to secure the first portion 46 of the housing 12 to the second portion 48 of the housing 12. The second portion 48 includes a contact surface 91 of engaging contact surface 86 of the first portion 46.

The second portion 48 of the housing 12 further includes a plurality of spaced-apart walls 92. The plurality of spaced-apart walls 92 extend generally parallel to the longitudinal centerline 30 of the aperture 26. The plurality of spaced-apart walls 92 form a plurality of spaced-apart passages 94 in the internal cavity 32 of the housing 12. The plurality of spaced-apart passages 94 are configured to receive electrical conductors 22 and terminals 24. The passages 94 are adapted to provide a location for the conductors 22 to be connected to the terminals 24.

As shown in FIG. 9, a sufficient number of passages 94 are provided such that each terminal 24 may be electrically and mechanically isolated from each of the other terminals 24. Similarly, the number of passages 94 may be sufficient such that only one electrical conductor 22 needs to be placed in a particular passage 94. Therefore, the passages 94 serve to electrically isolate the electrical conductors 22 from each other and the terminals 24 from each other. It should be further appreciated that the spaced-apart walls 92 serve to further prohibit the passage of the nut 18 into the internal cavity 32 of the second portion 48 of the housing 12.

The first portion 46 and the second portion 48 of the housing 12 may be made of any suitable, durable materials and may be made of electrically conductive materials or electrically insulative materials. Preferably, the first portion 46 and the second portion 48 of the housing 12 are made of electrically insulative materials, such as a composite or a polymer. The first portion 46 and the second portion 48 may be manufactured by a molding process. If, alternately, made of electrically conductive materials, the first portion 46 and the second portion 48 of the housing 12 may be made of a suitable, durable metal.

Figure 10:
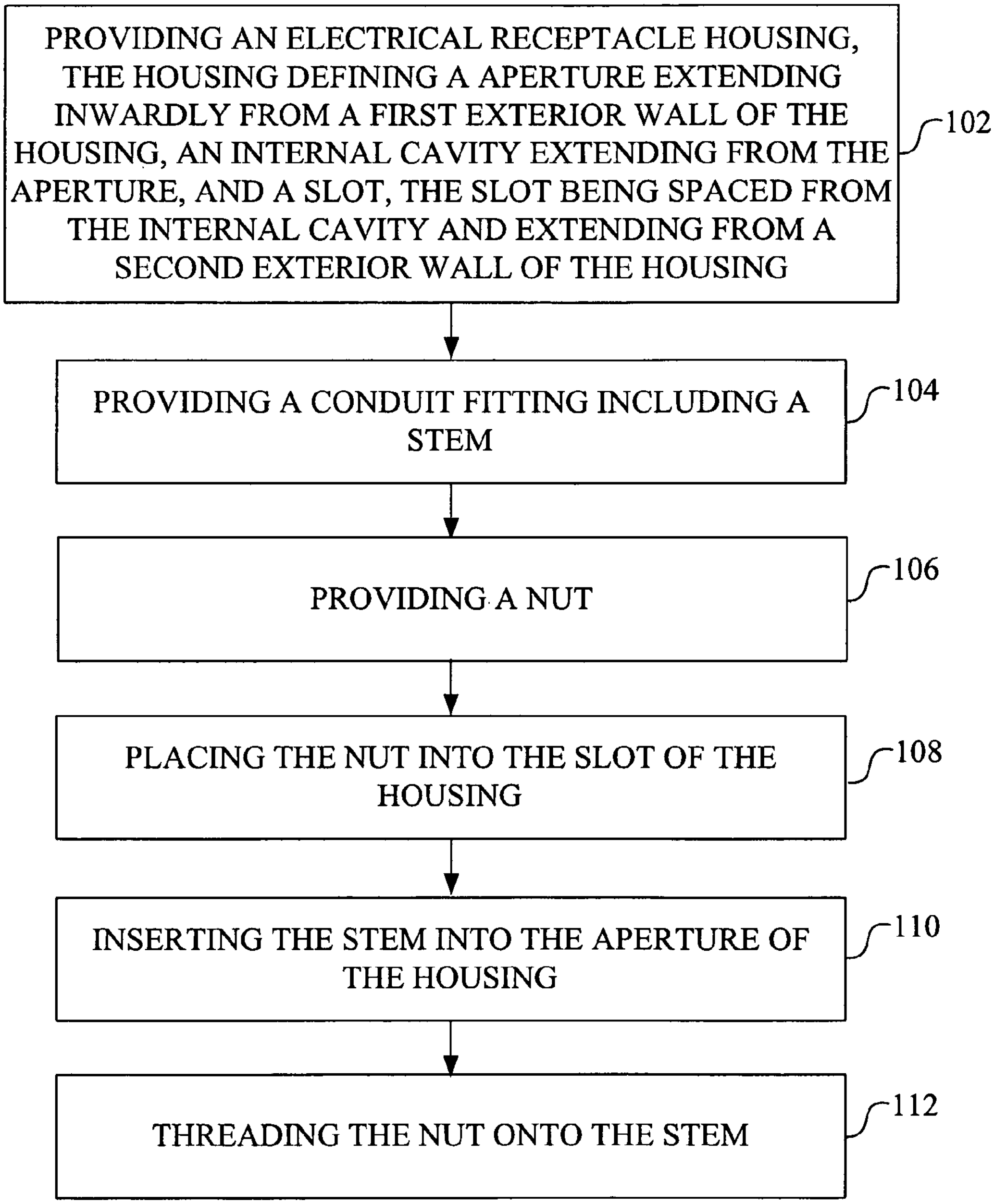
FIG. 10 is a flow diagram of a method for wiring an electrical receptacle, according to the present invention.

Referring now to FIG. 10, another embodiment of the present invention is shown as method 100 of wiring an electrical receptacle. The method 100 includes a step 102 of providing an electrical receptacle housing. The housing defines an aperture and a slot. The slot extends inwardly from a first electrical wall of the housing. An internal cavity extends from the aperture. The slot is spaced from the internal cavity and extends from a second exterior wall of the housing and terminates in a rear wall.

The method 100 further includes step 104 of providing a conduit fitting including a stem and step 106 of providing a nut. The method 100 further includes a step 108 of placing the nut into the slot of the housing and a step 110 of inserting the stem into the aperture of the housing. The method 100 further includes a step 112 of threading the nut onto the stem.

While this invention has been described with respect to at least one embodiment, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. An isolator assembly, comprising:

an electrical receptacle housing, said housing defining an aperture extending inwardly from a first exterior wall of said housing and defining a longitudinal centerline of the aperture, said housing further defining an internal cavity extending from the aperture and a slot spaced from the internal cavity and extending from a second exterior wall of said housing, said slot being generally perpendicular to the longitudinal centerline of the aperture;

a plurality of terminals positioned in the internal cavity of, and coupled with, said housing;

an internally threaded nut received within said slot of said housing;

a conduit fitting including an externally threaded stem having a portion thereof received within said aperture of said housing and threadingly engaged with said nut; and a flexible conduit connected to said conduit fitting, said flexible conduit containing a plurality of electrical conductors connected to said plurality of terminals within said housing.

2. The isolator assembly of claim 1, wherein said housing includes a first portion and a second portion thereof, the first portion defining the aperture and the slot, the second portion defining at least a portion of the internal cavity, the internal cavity configured to receive at least a portion of the plurality of electrical conductors.

3. The isolator assembly of claim 2, wherein the second portion is removably secured to the first portion.

4. The isolator assembly of claim 2, wherein the second portion defines a plurality of spaced apart walls extending generally perpendicular to the first exterior wall.

5. The isolator assembly of claim 1, wherein said housing forms a plurality of spaced apart passages in the internal cavity of said housing, at least one of the plurality of spaced apart passages configured to receive at least one of the plurality of electrical conductors.

6. The isolator assembly of claim 5, wherein each of said plurality of electrical conductors is received in at least one of said plurality of spaced apart passages.

7. The isolator assembly of claim 5, wherein each of said plurality of electrical terminals is positioned in one of the plurality of spaced apart passages.

8. The isolator assembly of claim 1, wherein said housing defines a third wall spaced from and parallel to the first exterior wall, the slot being positioned between the first exterior wall and the third wall, the third wall separating the slot from the internal cavity, the aperture extending inwardly from the third wall and into the internal cavity.

9. The isolator assembly of claim 1, wherein said nut is sized to prohibit passage of said nut through the aperture and into the internal cavity.

10. The isolator assembly of claim 1, wherein said nut is sized to permit rotation of said nut within the slot.

11. The isolator assembly of claim 1, wherein the slot is a blind slot, the blind slot terminating in a back wall of said housing.

12. An electrical receptacle for use with a conduit assembly including a nut, a fitting, and a flexible conduit, the electrical receptacle comprising an electrical receptacle housing, said housing defining an aperture extending inwardly from a first exterior wall of said housing, said housing further defining an internal cavity extending from the aperture and a slot spaced from the internal cavity and extending from a second exterior wall of said housing, a portion of the slot passing through the aperture, wherein said housing adjacent the slot is sized to permit rotation of the nut within the slot.

13. The electrical receptacle of claim 12, wherein said housing includes a first portion and a second portion thereof, the first portion defining the aperture and the slot, the second portion defining at least a portion of the internal cavity.

14. The electrical receptacle of claim 13, wherein the second portion is removably secured to the first portion.

15. The isolator assembly of claim 13, wherein the second portion defines a plurality of spaced apart walls extending generally perpendicular to the first exterior wall, the plurality of spaced apart walls defining a plurality of spaced apart chambers.

16. The electrical receptacle of claim 12, wherein said housing forms a plurality of passages in the internal cavity of said housing.

17. The electrical receptacle of claim 12, wherein said housing defines a third wall spaced from and parallel to the first exterior wall, the slot positioned between the first exterior wall and the third wall, said third wall separating at least a portion of the slot from the internal cavity, the aperture extending inwardly from the third wall and toward the internal cavity.

18. The electrical receptacle of claim 12, wherein said housing adjacent the slot and the aperture is sized to prohibit passage of the nut through the aperture and into the internal cavity.

19. The isolator assembly of claim 12, wherein the slot is a blind slot, the blind slot terminating in a back wall of said electrical receptacle housing.

20. A method for wiring an electrical receptacle, comprising the step of:

providing an electrical receptacle housing, the housing defining an aperture extending inwardly from a first exterior wall of the housing, an internal cavity extending from the aperture, and a slot, the slot being spaced from the internal cavity and extending from a second exterior wall of the housing;

providing a conduit fitting including a stem;

providing an internally threaded nut;

placing the nut into the slot of the housing;

inserting the stem into the aperture of the housing; and threading the nut onto the stem.

21. The method of claim 20:

wherein the electrical receptacle housing includes a first housing portion and a second housing portion, the first housing portion defining the aperture and the slot and the second housing portion defining the internal cavity;

further comprising the step of providing a flexible conduit containing electrical conductors;

further comprising the step of inserting a portion of the electrical conductors through the conduit fitting and into the internal cavity;

further comprising the step of providing terminals positioned within the internal cavity of, and coupled with, the electrical receptacle housing;

further comprising the step of connecting the electrical conductors to the terminals within the electrical receptacle housing; and further comprising the step of connecting the first housing portion to the second housing portion.

22. The method of claim 20, further comprising the steps of:

providing that the slot of the electrical receptacle housing terminates in a rear wall;

providing a flexible conduit containing electrical conductors;

inserting a portion of the electrical conductors through the conduit fitting and into the internal cavity; and connecting the electrical conductors to terminals within the electrical receptacle housing.

* * * * *